(12) United States Patent
Sagawa et al.

(10) Patent No.: US 7,902,754 B2
(45) Date of Patent: Mar. 8, 2011

(54) DISPLAY DEVICE AND METHOD OF MANUFACTURING DISPLAY DEVICE

(75) Inventors: Hiroshi Sagawa, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 210 days.

(21) Appl. No.: 12/364,102

(22) Filed: Feb. 2, 2009

(65) Prior Publication Data

US 2009/0200937 A1    Aug. 13, 2009

(30) Foreign Application Priority Data

Feb. 13, 2008    (JP) ................................. 2008-031559

(51) Int. Cl.
*H05B 33/02*    (2006.01)

(52) U.S. Cl. ............................ 313/509; 445/24; 313/506

(58) Field of Classification Search .................... 257/40, 257/72, 98–100, 642–643, 759; 313/498–512; 427/58, 64, 66, 532–535, 539; 428/690–691, 428/917; 438/26–29, 34, 82; 445/24–25; 315/169.1, 169.3
See application file for complete search history.

(56) References Cited

FOREIGN PATENT DOCUMENTS

JP    2006-54111    2/2006

*Primary Examiner* — Nimeshkumar D Patel
*Assistant Examiner* — Donald L Raleigh
(74) *Attorney, Agent, or Firm* — SNR Denton US LLP

(57) ABSTRACT

A display device includes lead wiring drawn out from a display region to a peripheral region of the display region; a first insulating film covering the lead wiring disposed on a substrate; a plurality of pieces of annular wiring disposed in a state of enclosing the display region in a multiple manner between the display region and the peripheral region on the first insulating film; a second insulating film covering the annular wiring disposed above the substrate, and having a groove pattern having each of the pieces of annular wiring as a bottom surface; and a light emitting element disposed on the second insulating film within the display region.

8 Claims, 12 Drawing Sheets

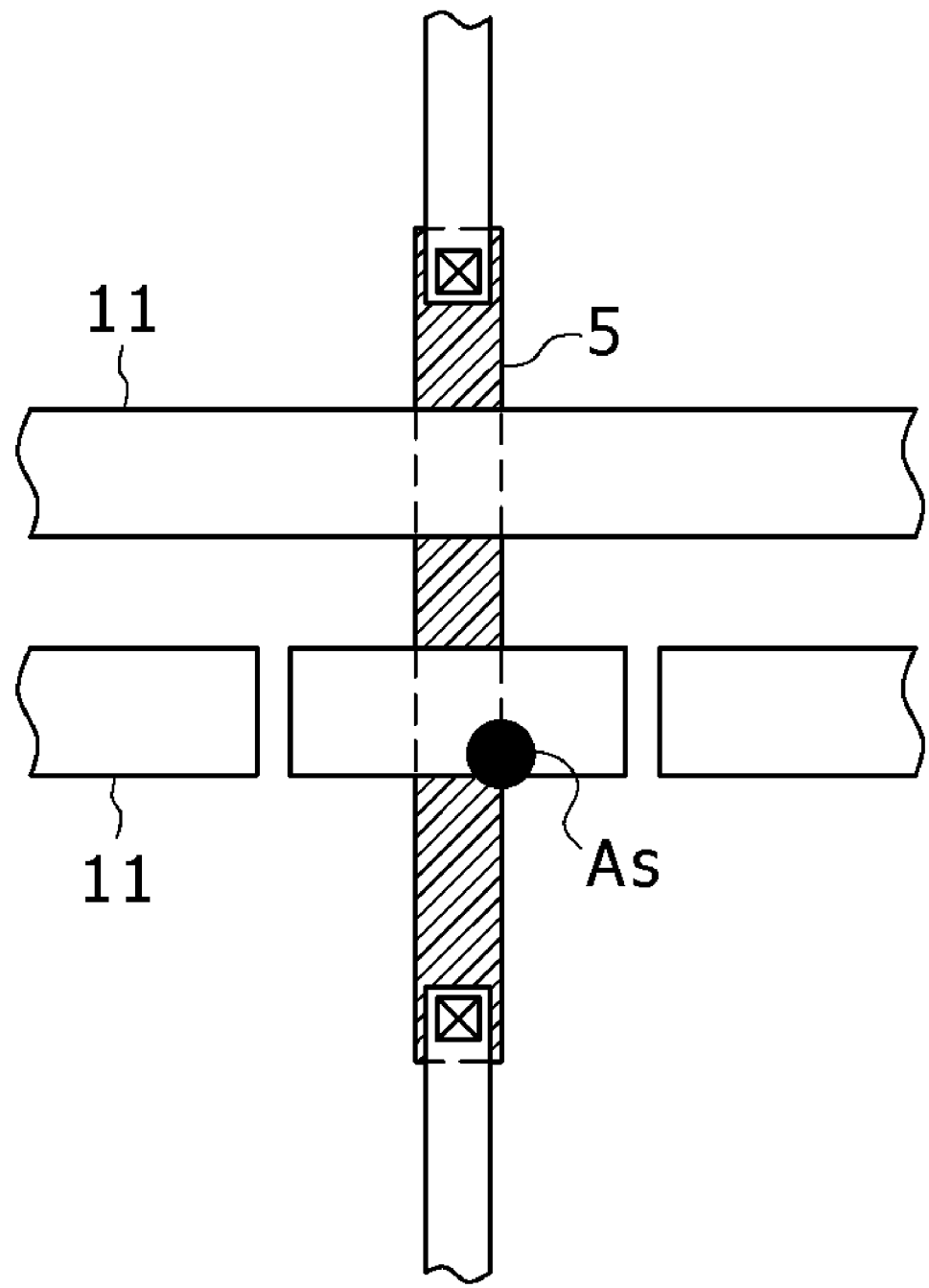

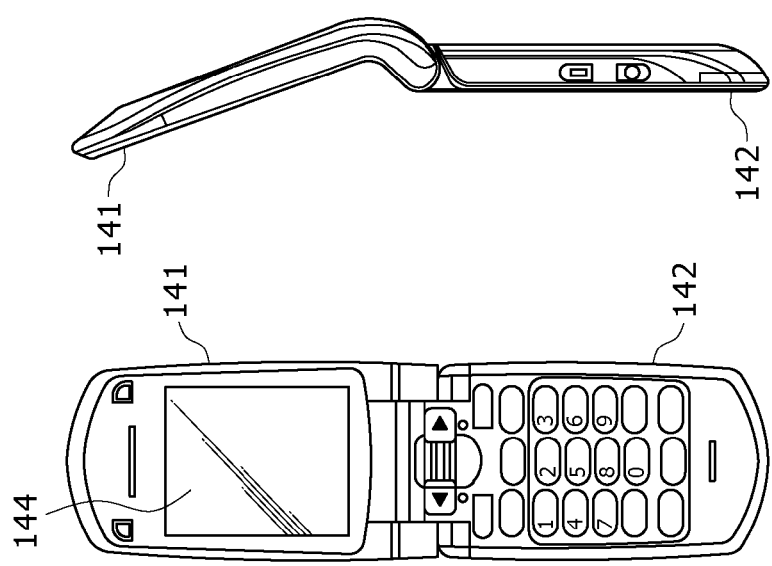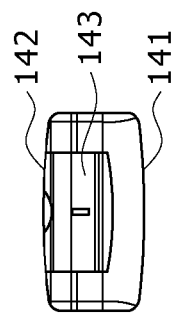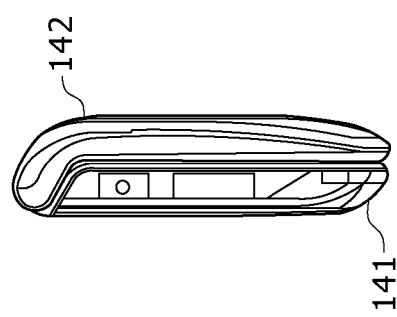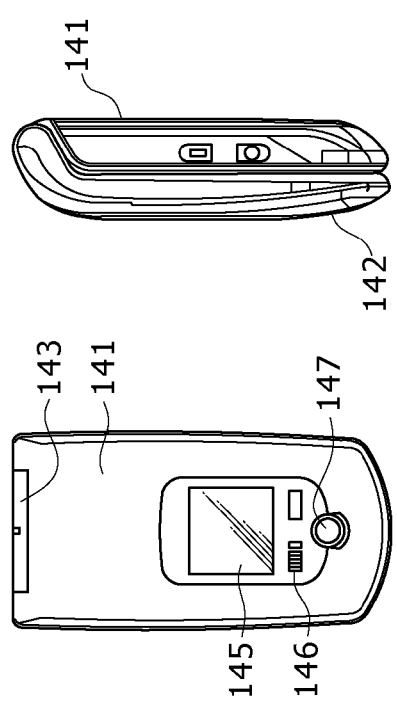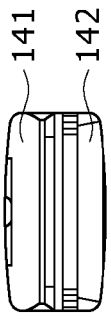

DISPLAY DEVICE AND METHOD OF MANUFACTURING DISPLAY DEVICE

CROSS REFERENCES TO RELATED APPLICATIONS

The present invention contains subject matter related to Japanese Patent Application JP 2008-031559, filed in the Japan Patent Office on Feb. 13, 2008, the entire contents of which being incorporated herein by reference.

BACKGROUND OF THE INVENTION

1. Field of the Invention

The present invention relates to a display device and a method of manufacturing the display device, and particularly to a display device that can be repaired easily and which provides a high margin for a manufacturing process, and a method of manufacturing the display device.

2. Description of the Related Art

An organic electroluminescent light emitting element (so-called organic EL element) using the electroluminescence (hereinafter described as EL) of an organic material is formed by disposing an organic layer between two electrodes, the organic layer being formed by laminating an organic hole transporting layer and an organic light emitting layer, and is drawing attention as a light emitting element capable of high-luminance light emission through low-voltage direct-current driving. However, in a display device using organic EL elements (that is, an organic EL display device), the organic layers of the organic EL elements are degraded by absorbing moisture, so that light emission luminance of each organic EL element is lowered or light emission of each organic EL element becomes unstable, for example. The display device thus has problems of low secular stability and short life.

Accordingly, in such a display device (organic EL display device), infiltration of water into a display region is prevented by providing a separating groove enclosing the display region in a planarizing insulating film serving as a foundation for organic EL elements. In addition, a constitution is proposed in which a pattern made of a wiring material is provided at the bottom part of the separating groove, thereby alleviating the step stress of the separating groove, and the pattern is connected as auxiliary wiring to the upper electrode of the organic EL element (see Japanese Patent Laid-Open No. 2006-54111 (FIG. 1 and FIG. 3(B') in particular)).

SUMMARY OF THE INVENTION

When the auxiliary wiring is pattern-formed at the bottom part of the separating groove, the auxiliary wiring can be disposed as ring-shaped auxiliary wiring (annular auxiliary wiring) enclosing the display region as with the separating groove. Thereby an area of connection between the upper electrode and the annular auxiliary wiring can be increased. However, when the auxiliary wiring is formed as the annular auxiliary wiring, lead wiring such as a scanning line, a signal line, a power control line and the like is arranged from the display region to a peripheral region on the periphery of the display region in a state of crossing the annular auxiliary wiring in a layer below the annular auxiliary wiring. In such a constitution, a short circuit tends to occur due to foreign matter or a pattern abnormality at a position where the annular auxiliary wiring and the lead wiring cross each other.

Thus, when a short circuit occurs between for example the lead wiring of a signal line and the annular auxiliary wiring, all pixels connected to the signal line become dark dots, and one line of the pixels becomes a dark line. The same is true for the scanning line and the power control line.

It is accordingly desirable to provide a display device and a method of manufacturing the display device that allow a short-circuit part between lead wiring and auxiliary wiring disposed above the lead wiring to be repaired easily and which provide a high margin for a manufacturing process.

According to an embodiment of the present invention, there is provided a display device including: lead wiring drawn out from a display region to a peripheral region of the display region; a first insulating film covering the lead wiring disposed on a substrate; and a plurality of pieces of annular wiring disposed in a state of enclosing the display region in a multiple manner between the display region and the peripheral region on the first insulating film. The display device further includes: a second insulating film covering the annular wiring disposed above the substrate, and having a groove pattern having each of the pieces of annular wiring as a bottom surface is provided; and a light emitting element disposed on the second insulating film within the display region.

According to the embodiment of the present invention, there is also provided a method of manufacturing the display device, in which method the following steps are performed. In a first step, lead wiring drawn out from a display region to a peripheral region of the display region is formed. In a second step, a substrate on which the lead wiring is disposed is covered by a first insulating film. In a third step, a plurality of pieces of annular wiring are formed in a state of enclosing the display region in a multiple manner between the display region and the peripheral region on the first insulating film. In a fourth step, the lead wiring and the annular wiring are checked. Then, in a fifth step, when a defective part is found in a check in the fourth step, the defective part of the annular wiring is repaired. In addition, after the fourth step, a second insulating film covering the substrate above which the annular wiring is disposed, and having a plurality of groove patterns having each of the pieces of annular wiring as a bottom surface is formed. In a next seventh step, a light emitting element is formed on the second insulating film within the display region.

In the display device and the method of manufacturing the display device as described above, the plurality of pieces of annular wiring are disposed in a multiple manner. Therefore, when a short circuit occurs between one piece of the annular wiring and the lead wiring, the short-circuit part of the annular wiring is disconnected (repaired) to avoid the short circuit with the lead wiring, while a normal wiring function is maintained by the remaining annular wiring.

As described above, according to the present invention, by providing the multiple pieces of annular wiring, a short-circuit part between the lead wiring and the annular wiring disposed above the lead wiring can be easily repaired by disconnecting a part of the annular wiring, while a normal wiring function can be maintained by the remaining annular wiring. As a result, a margin for a process of manufacturing the display device can be increased.

BRIEF DESCRIPTION OF THE DRAWINGS

FIG. 7 is a diagram of assistance in explaining a repair of a short circuit between lead wiring and annular auxiliary wiring due to foreign matter;

FIGS. 14A to 14G are diagrams showing a portable terminal device, for example a portable telephone to which the present invention is applied, FIG. 14A being a front view of the portable telephone in an opened state, FIG. 14B being a side view of the portable telephone in the opened state, FIG. 14C being a front view of the portable telephone in a closed state, FIG. 14D being a left side view of the portable telephone in the closed state, FIG. 14E being a right side view of the portable telephone in the closed state, FIG. 14F being a top view of the portable telephone in the closed state, and FIG. 14G being a bottom view of the portable telephone in the closed state.

DETAILED DESCRIPTION OF THE PREFERRED EMBODIMENT

A preferred embodiment of the present invention will hereinafter be described in detail with reference to the drawings. Incidentally, in the embodiments, description will be made of a general constitution of a display device, a pixel circuit on a lower layer side close to a substrate, a constitution of a light emitting element disposed above the pixel circuit, and a method of manufacturing the display device in this order.
<General Constitution of Display Device>

Figure 1:
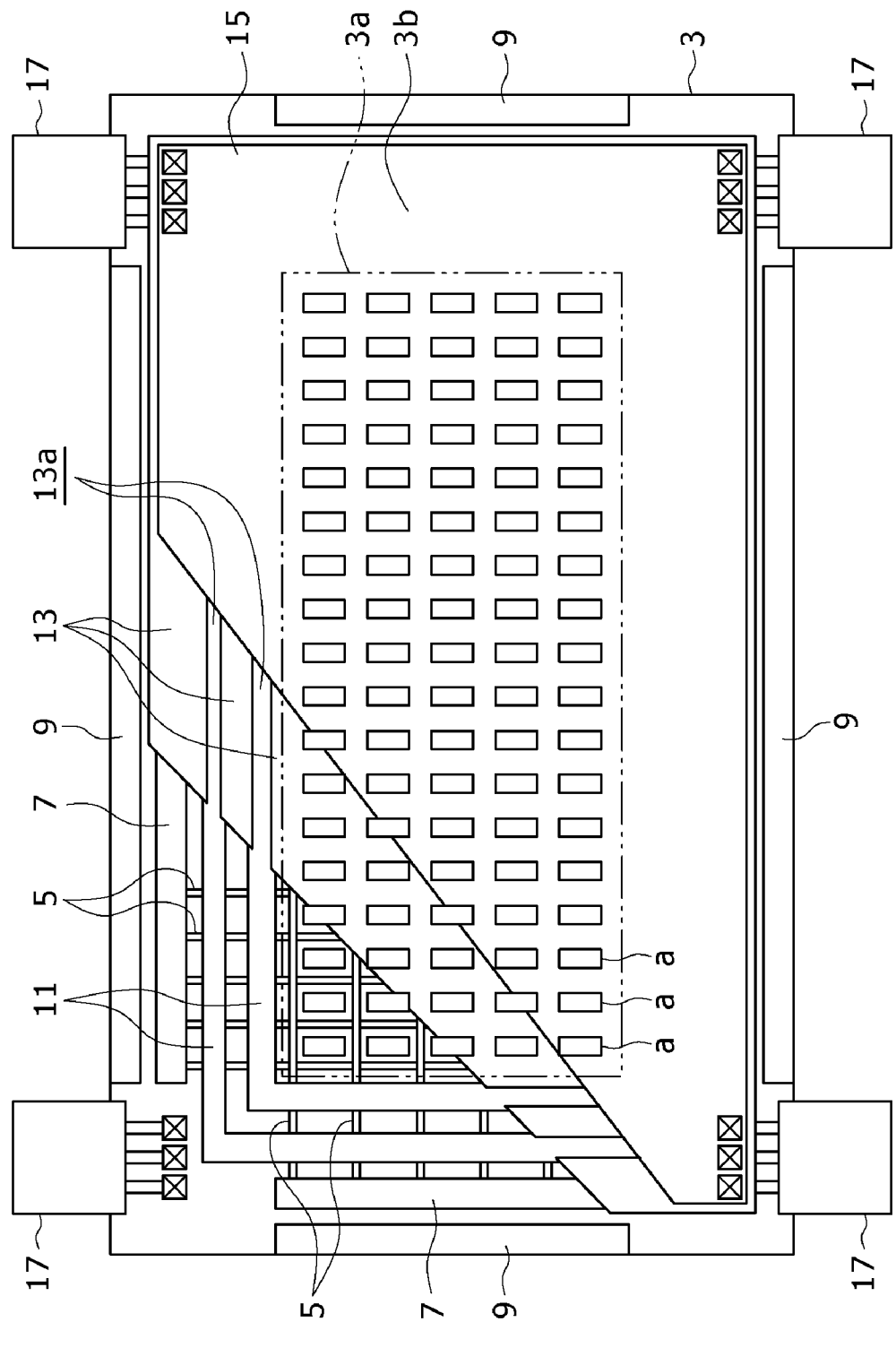
FIG. 1 is a layout diagram showing outlines of a general constitution of a display device according to an embodiment.

FIG. 1 is a layout diagram showing a general constitution of a display device 1 according to an embodiment, and is a plan view with a part of constituent elements cut away. The display device 1 shown in this figure is an organic EL display device formed by arranging organic electroluminescent light emitting elements EL, and is an active matrix driving display device in which each organic electroluminescent light emitting element EL is connected with a driving circuit.

As shown in this figure, a display region 3a having a substantially rectangular plane shape is set on a substrate 3 forming the display device 1. A plurality of pixels a are arranged within the display region 3a. Each pixel a has a substantially rectangular plane shape, and is disposed such that for example a direction of longer sides of the pixel a coincides with a direction of shorter sides of the display region 3a. Lead wiring 5 is drawn out from the display region 3a to an outer circumference side.

On the other hand, a peripheral circuit section 7 having various driving circuits arranged therein is provided in a peripheral region 3b outside the display region 3a. The lead wiring 5 drawn out from the display region 3a is routed to the peripheral circuit section 7, and thus the lead wiring 5 is routed over the display region 3a and the peripheral circuit section 7 of the peripheral region 3b. Further, a pad section 9, in which a plurality of terminals drawn out from the peripheral circuit section 7 are arranged, is provided on the outside of the peripheral circuit section 7 in the peripheral region 3b.

In addition, a plurality of annular pieces of wiring 11 are characteristically arranged in a state of enclosing the display region 3a in a multiple manner between the display region 3a and the peripheral region 3b. These annular pieces of wiring 11 are so-called annular auxiliary wiring 11 provided as auxiliary wiring for an upper electrode of an "organic electroluminescent light emitting element EL" (to be described later in detail). These annular pieces of wiring 11 are arranged on a first insulating film (not shown in FIG. 1) covering the lead wiring 5, whereby insulation of the annular pieces of wiring 11 from the lead wiring 5 is maintained.

Incidentally, each pixel a in the display region 3a is provided with a "pixel circuit" (to be described later in detail) formed by using the same wiring layers as the lead wiring 5 and the annular auxiliary wiring 11 described above. In addition, a driving circuit formed by using the same wiring layers as the lead wiring 5 and the annular auxiliary wiring 11 described above is provided in the peripheral circuit section 7 in the peripheral region 3b, and terminals are provided in the pad section 9.

The top of the substrate 3, on which the lead wiring 5 and the annular auxiliary wiring 11 as described above as well as the pixel circuit, the driving circuit, and the terminals are formed, is covered with a second insulating film 13. The second insulating film 13 is characteristically provided with ring-shaped groove patterns 13a having the respective multiple pieces of annular auxiliary wiring 11 as a bottom surface. FIG. 1 shows two ring-shaped groove patterns 13a arranged double in a state of enclosing the display region 3a. Thereby, the second insulating film 13 is separated into a part covering the display region 3a and a part on the outside of the display region 3a, and the part on the outside of the display region 3a is separated into a plurality of parts corresponding in number to the groove patterns 13a. Incidentally, suppose that the pad section 9 is disposed in a state of being exposed from the first insulating film and the second insulating film 13.

In addition, suppose that the second insulating film 13 is a film serving as a foundation layer for an organic electroluminescent light emitting element EL disposed in each pixel a within the display region 3a, and is formed as a planarizing insulating film having a flat surface. Such a second insulating film 13 may be formed using an organic material, or may be a laminated structure of an inorganic material film as a lower layer and an organic material film as an upper layer.

The upper electrode 15 of the organic electroluminescent light emitting element EL to be described later in detail is provided over the second insulating film 13 in the form of a solid film as an electrode common to the pixels a. The upper electrode 15 is characteristically connected to the annular auxiliary wiring 11 in the bottom parts of the groove patterns 13a. That is, the upper electrode 15 is connected to each of the plurality of pieces of annular auxiliary wiring 11 enclosing the display region 3a.

In addition, as in the existing case, the upper electrode 15 is supplied with a power supply voltage from a power supply TCP (Tape Carrier Package) 17 connected to the upper electrode 15 at four corners on the outside of the display region 3a. Incidentally, the power supply TCP 17 is not limited to a constitution in which the power supply TCP 17 is connected to the upper electrode 15 at the four corners on the outside of the display region 3a, but may be of a constitution in which the power supply TCP 17 is connected to the upper electrode 15 at an appropriate position.

<Pixel Circuit>

Figure 2:
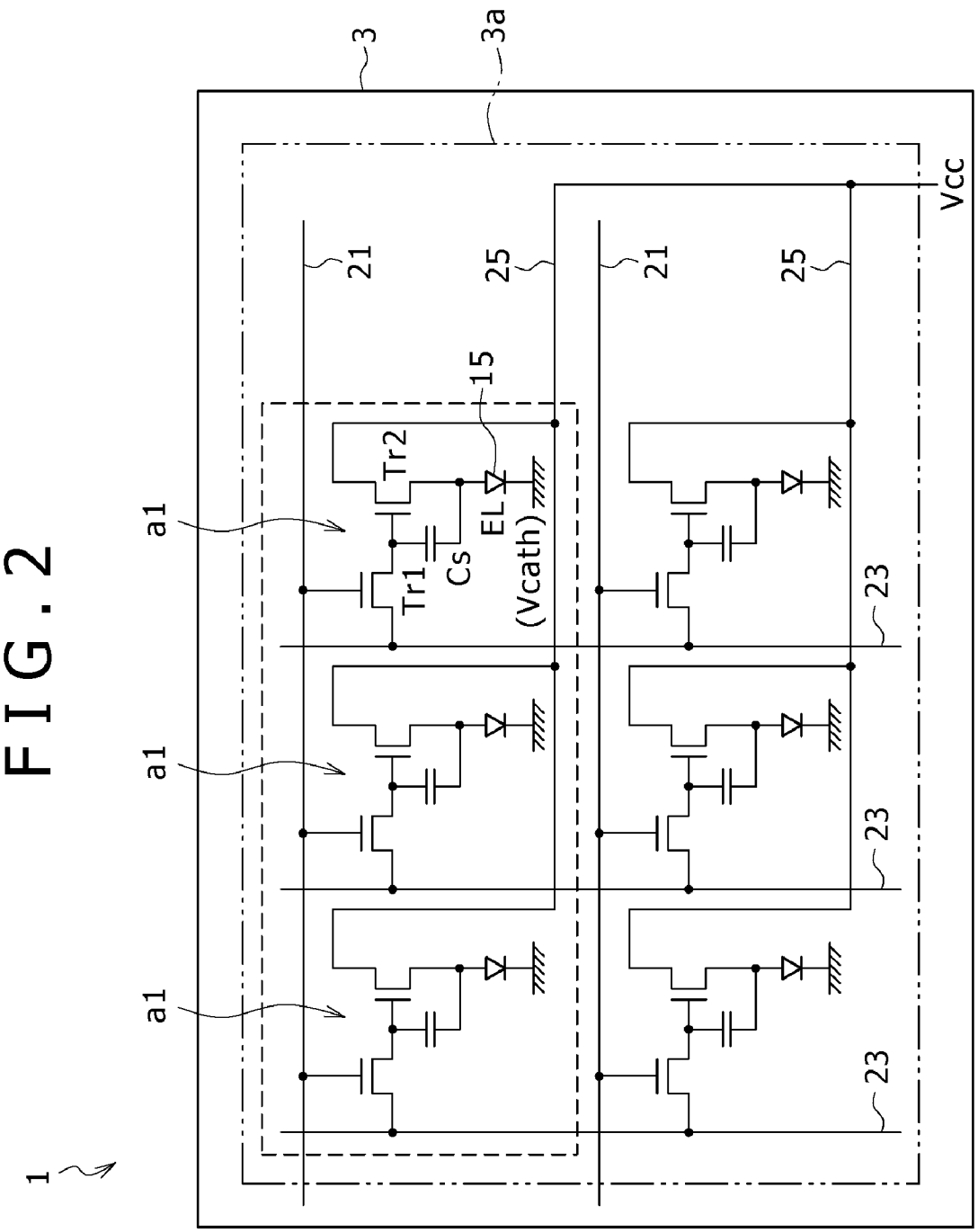
FIG. 2 is a circuit diagram showing a configuration of pixel circuits of the display device according to the embodiment.
Figure 3:
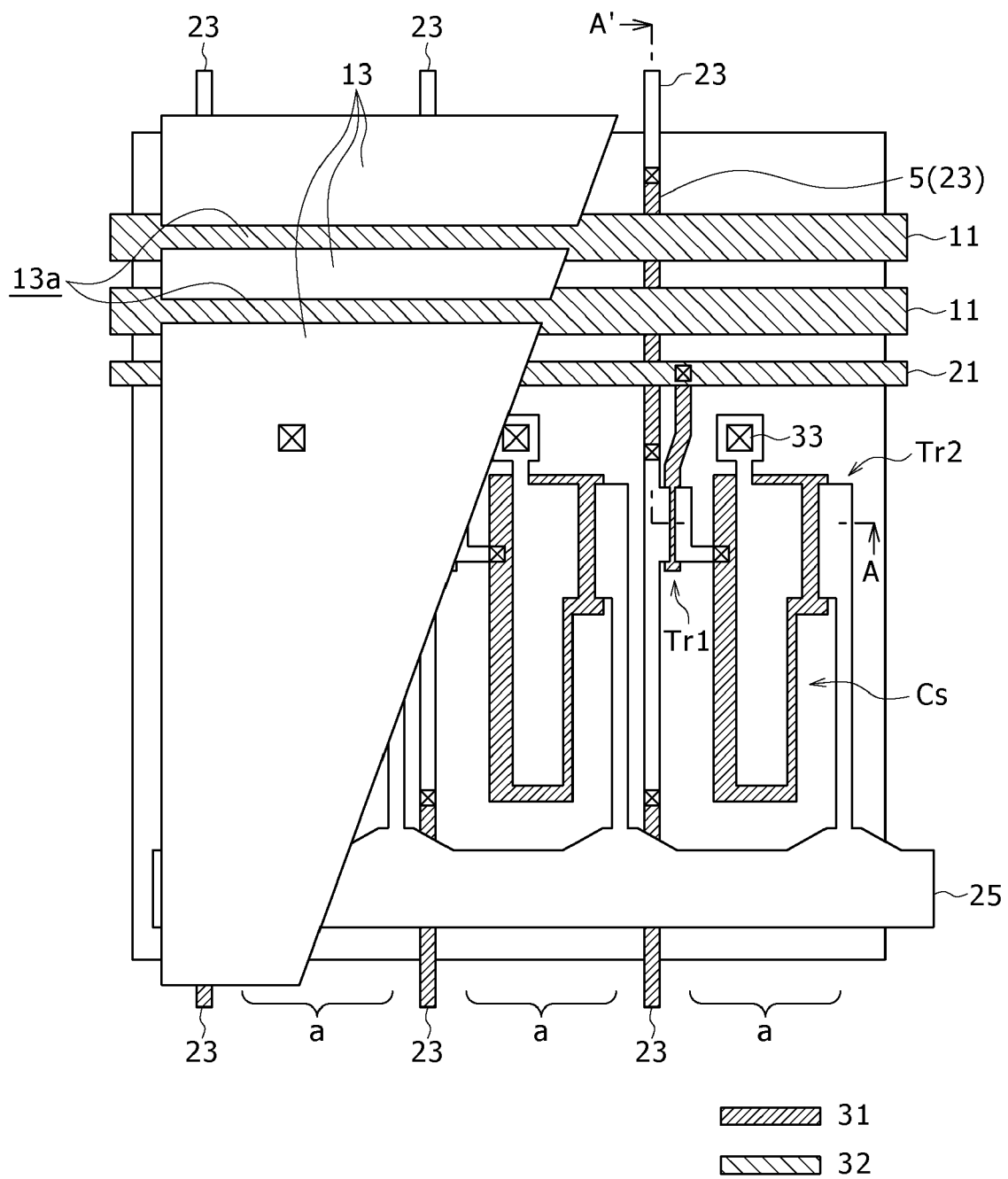
FIG. 3 is a layout diagram of pixel circuits in the display device according to the embodiment.

The constitution of the pixel circuit provided for each pixel a of the display device 1 will next be described. FIG. 2 is a circuit diagram showing pixel circuits for six pixels within the display region 3a in FIG. 1. FIG. 3 is a plan layout view of three pixels in FIG. 2 and the periphery thereof in an enlarged state.

As shown in these figures, within the display region 3a on the substrate 3 in the display device 1, a plurality of scanning lines 21 are arranged along the longer sides of the display region 3a, and a plurality of signal lines 23 are arranged along a direction of the shorter sides of the display region 3a. One pixel a is disposed at a part where each scanning line 21 intersects a signal line 23.

The pixel circuit provided for each pixel includes for example a thin film transistor Tr1 for switching, a thin film transistor Tr2 for driving, and a capacitive element Cs retaining a capacitance. The lower electrode of the organic electroluminescent light emitting element EL is connected to the capacitive element Cs and the thin film transistor Tr2 for driving. In addition, the thin film transistor Tr2 for driving and the capacitive element Cs are connected to a common power supply line (Vcc) 25.

As shown in FIG. 3, the pixel circuit of such a constitution includes a first conductive layer 31 provided on the substrate 3, a semiconductor layer not shown in the figure, a first insulating film (not shown) as a gate insulating film covering these layers, and a second conductive layer 32 disposed on the first insulating film. Of these layers, the first conductive layer 31 is a lowest conductive layer, and is thus formed of a high melting point metal such as tungsten (W) or the like that is resistant to a thermal process. On the other hand, the second conductive layer 32 is formed of a metallic material having excellent conductivity, such as aluminum (Al) or the like.

In addition, a contact part 33 of the organic electroluminescent light emitting element EL for the capacitive element Cs and the thin film transistor Tr2 for driving is disposed in a part of the second conductive layer 32 forming the upper electrode of the capacitive element Cs.

The scanning lines 21, the signal lines 23, and the power supply lines 25 are drawn out as lead wiring 5 from the display region 3a to the peripheral region 3b on the periphery of the display region 3a. These pieces of lead wiring 5 are connected to the driving circuit disposed in the peripheral circuit section 7 in the peripheral region 3b, as described above with reference to FIG. 1.

Then, the driving circuit drives a scanning line 21, whereby a video signal written from a signal line 23 via the thin film transistor Tr1 for switching is retained in the capacitive element Cs. A current corresponding to the retained signal quantity is supplied from the thin film transistor Tr2 for driving to the organic electroluminescent light emitting element EL. The organic electroluminescent light emitting element EL emits light at a luminance corresponding to the value of the current.

It is to be noted that the constitution of the pixel circuit as described above is only an example, and that a capacitive element may be disposed within the pixel circuit as needed or the pixel circuit may be formed further including a plurality of thin film transistors.

Further, as shown in FIG. 3 in particular, in the present embodiment, the annular auxiliary wiring 11 made of the second conductive layer 32 formed of a metallic material having excellent conductivity such as aluminum (Al) or the like is disposed in a state of enclosing the display region 3a in a multiple manner. The annular auxiliary wiring 11 is disposed in a state of crossing over the lead wiring 5 with the second insulating film (gate insulating film) not shown in FIG. 3 interposed between the annular auxiliary wiring 11 and the lead wiring 5. Thus, the lead wiring 5 crossing the annular auxiliary wiring 11 is formed of the first conductive layer 31. Incidentally, the drawing shows a part where the annular auxiliary wiring 11 crosses over the lead wiring 5 of the signal lines 23, and the same is true for the scanning lines 21 and the power supply lines 25.

Incidentally, the driving circuit formed by using the same layers as the above-described pixel circuit is disposed in the peripheral circuit section of the peripheral region 3b shown in FIG. 1.

As described above, the top of the substrate 3, on which the pixel circuit as described above, the lead wiring 5 and the annular auxiliary wiring 11, and the pixel circuit, the driving circuit, and the terminals are formed, is covered with the second insulating film 13 formed as a planarizing insulating film, and the second insulating film 13 is provided with ring-shaped groove patterns 13a having the respective multiple pieces of annular auxiliary wiring 11 as a bottom surface. The organic electroluminescent light emitting element EL having a constitution to be described below is disposed on the second insulating film 13, the organic electroluminescent light emitting element EL being connected to the pixel circuit via the contact part 33 (connecting hole) provided in the second insulating film 13.

Incidentally, the second insulating film 13 covering the pixel circuit desirably has a laminated structure of an inorganic material film as a lower layer and an organic material film as an upper layer, so that surface flatness is maintained by the organic material film as the upper layer, while the pixel circuit is protected by the inorganic material film.

<Organic Electroluminescent Light Emitting Element>

Figure 4:
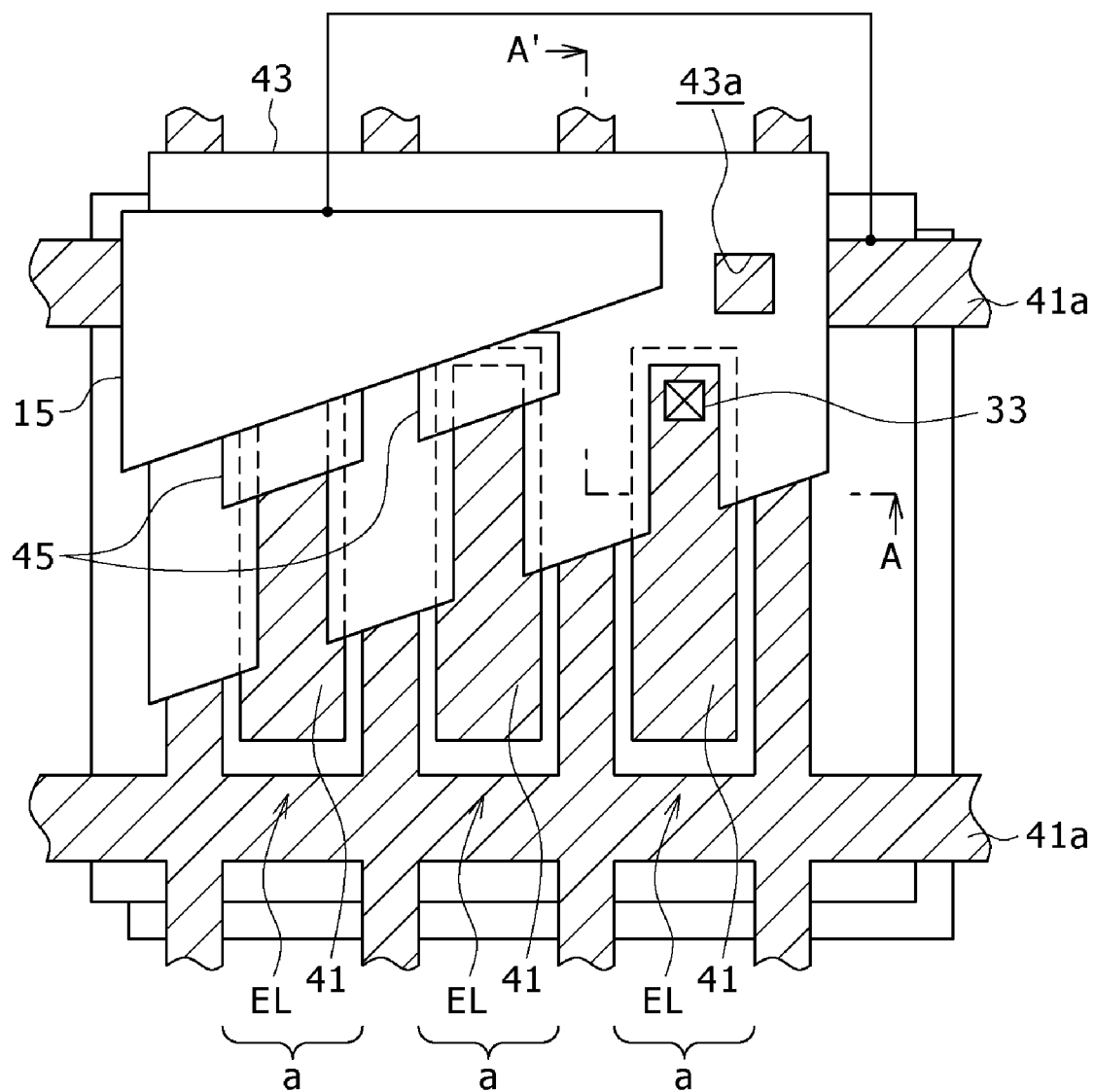
FIG. 4 is a principal part enlarged plan view of assistance in explaining a constitution of organic electroluminescent light emitting elements disposed in the display device according to the embodiment.

FIG. 4 is a plan view of assistance in explaining a constitution of the organic electroluminescent light emitting element EL disposed on the second insulating film 13, showing principal parts in an enlarged state. As shown in this figure, a plurality of lower electrodes 41 patterned as pixel electrodes corresponding to respective pixels a are disposed within the display region 3a on the second insulating film 13. The lower electrodes 41 are used as the anodes (or the cathodes) of organic electroluminescent light emitting elements EL. The lower electrodes 41 are connected to pixel circuits via the contact parts 33 (connecting holes) provided in the second insulating film 13.

In addition, suppose that auxiliary wiring 41a formed by the same layer as the lower electrodes 41 is arranged on the periphery of the lower electrodes 41. The auxiliary wiring 41a is arranged in the form of a lattice between the lower electrodes 41 with insulation of the auxiliary wiring 41a from the lower electrodes 41 maintained. The auxiliary wiring 41a may be connected to the annular auxiliary wiring 11 via the groove patterns 13a provided in the second insulating film 13.

In addition, the periphery of each lower electrode 41 is covered with a third insulating film 43, and a part where the lower electrode 41 is exposed from the third insulating film 43 is a pixel opening. Thus, the lower electrode 41 is patterned into a substantially rectangular shape a size larger than the pixel opening. Light emitting functional layers 45 completely covering the pixel openings are pattern-formed on the lower electrodes 41 exposed from the third insulating film 43. The light emitting functional layers 45 include at least an organic light emitting layer, and have a charge transporting layer and a charge injection layer laminated therein as needed. The light emitting functional layers 45 may have different laminated structures for each light emission color of the organic electroluminescent light emitting elements EL.

The upper electrode 15 in the form of a solid film common to the pixel openings is disposed in a state of covering the above light emitting functional layers 45. The upper electrode 15 is used as the cathodes (or the anodes) of the organic electroluminescent light emitting elements EL. Parts where the light emitting functional layers 45 are sandwiched between the lower electrodes 41 and the upper electrode 15 are the organic electroluminescent light emitting elements EL.

In this case, suppose that the upper electrode 15 is connected to the auxiliary wiring 41a via a connecting hole 43a provided in the third insulating film 43. Further, in particular, suppose that the upper electrode 15 is connected to the annular auxiliary wiring 11 via the groove patterns 13a provided in the second insulating film 13. Incidentally, when the auxiliary wiring 41a is connected to the annular auxiliary wiring 11 in the groove patterns 13a of the second insulating film 13, the upper electrode 15 is connected to the annular auxiliary wiring 11 via the auxiliary wiring 41a.

Incidentally, in order to secure an aperture ratio of the organic electroluminescent light emitting elements EL, it is effective to form the active matrix driving display device 1 including the driving circuit in a layer below the organic electroluminescent light emitting elements EL as a so-called top surface light extracting structure (hereinafter described as a top emission type), which extracts light from the side of the upper electrode 15 disposed on an opposite side from the substrate 3. Thus, suppose that the lower electrode 41 is formed of a light reflective material such as a metallic material or the like, and that the upper electrode 15 is formed of a light transmissive material. In addition, suppose that when the organic electroluminescent light emitting elements EL are formed as a resonant structure, the upper electrode 15 is formed of a semi-transmissive and semi-reflective material.

The upper electrode 15 having such a light transmissivity tends to cause a voltage drop because the upper electrode 15 is provided in the form of a solid film common to all the pixels. Therefore, the voltage drop in the upper electrode 15 is prevented by connecting the upper electrode 15 in the form of a solid film to the auxiliary wiring 41a formed by the same layer as the lower electrodes 41 made of a light reflective material such as a metallic material or the like and to the annular auxiliary wiring 11 formed of a metallic material having excellent conductivity, such as aluminum (Al) or the like, in a layer below the auxiliary wiring 41a.

Figure 5:
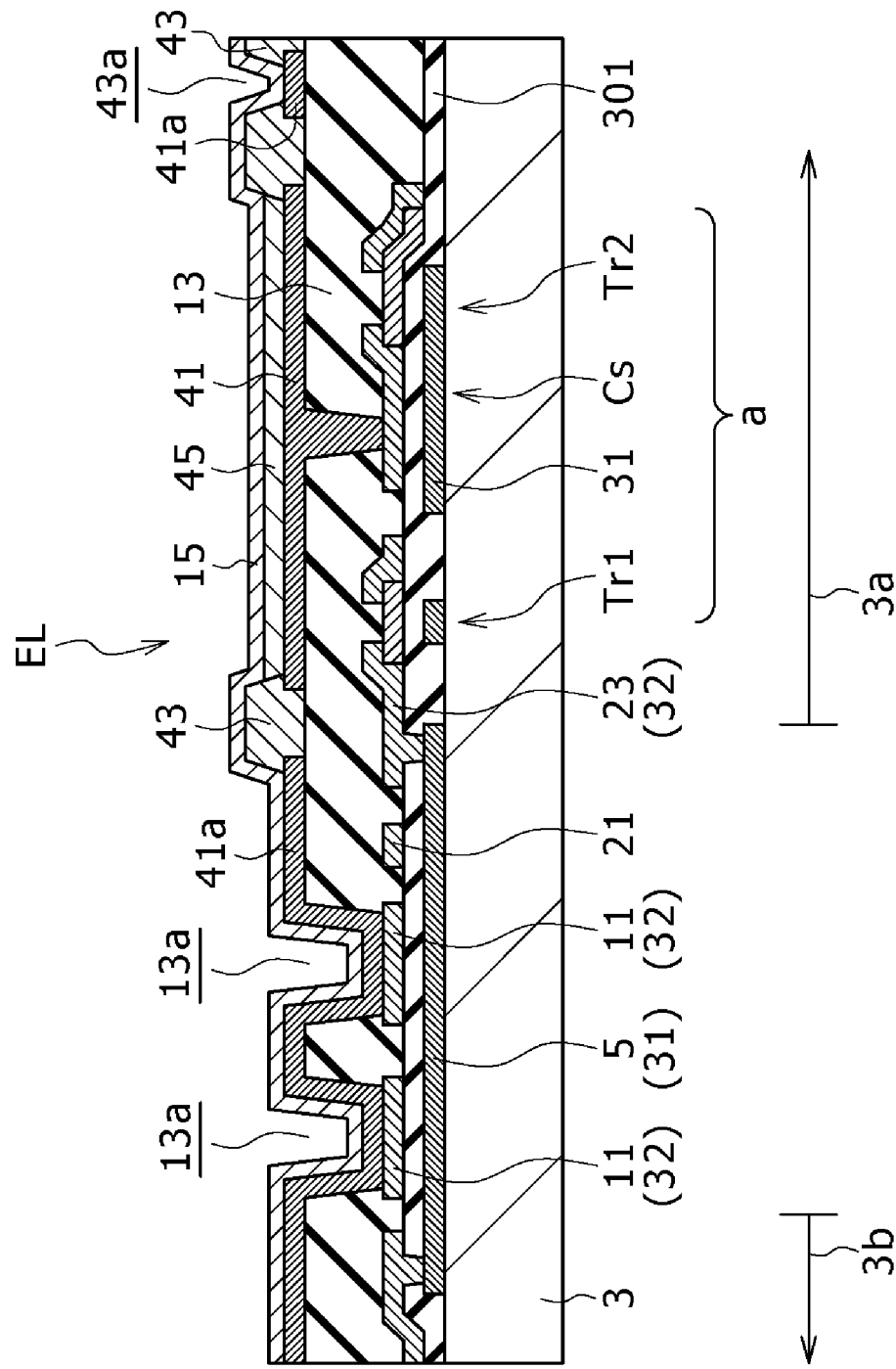
FIG. 5 is a sectional view corresponding to a section taken along a line A-A' in FIG. 3 and FIG. 4.

FIG. 5 is a sectional view corresponding to a section taken along a line A-A' in FIG. 4. Incidentally, FIG. 5 is a diagram corresponding also to a section taken along a line A-A' in FIG. 3. As shown in FIG. 5, each pixel a within the display region 3a on the substrate 3 is provided with the pixel circuit including the thin film transistors Tr1 and Tr2 and the capacitive element Cs. The lead wiring 5 is drawn out from each pixel circuit within the display region 3a to the peripheral region 3b. In addition, the multiple pieces of (double) annular auxiliary wiring 11 enclosing the display region 3a are disposed between the display region 3a and the peripheral region 3b.

These pixel circuits, the lead wiring 5, and the annular auxiliary wiring 11 are formed by using the first conductive layer 31 and the second conductive layer 32 as described above. The second insulating film 13 having a flat surface is disposed in a state of covering the pixel circuits, and the organic electroluminescent light emitting element EL is disposed on the second insulating film 13. The organic electroluminescent light emitting element EL is connected to one pixel circuit via the contact part 33 disposed within a connecting hole provided in a planarizing insulating film 34.

As described above, the organic electroluminescent light emitting element EL has a structure in which the light emitting functional layer 45 and the upper electrode 15 are laminated in this order on the exposed surface of the lower electrode 41 whose periphery is covered by the third insulating film 43. An opening part provided in the third insulating film 43 is a pixel opening, which coincides with the surface shape of the organic electroluminescent light emitting element EL. In addition, the auxiliary wiring 41a formed by the same layer as the lower electrode 41 is disposed on the side of the lower electrode 41. This auxiliary wiring 41a is connected to the annular auxiliary wiring 11 via the groove patterns 13a provided in the second insulating film 13. In addition, as described above, the third insulating film 43 is provided with the connecting hole 43a reaching the auxiliary wiring 41a, and the upper electrode 15 common to each organic electroluminescent light emitting element EL is connected to the auxiliary wiring 41a via the connecting hole 43a and is connected to the annular auxiliary wiring 11 via the auxiliary wiring 41a in the groove patterns 13a provided in the second insulating film 13.

Figure 6A:
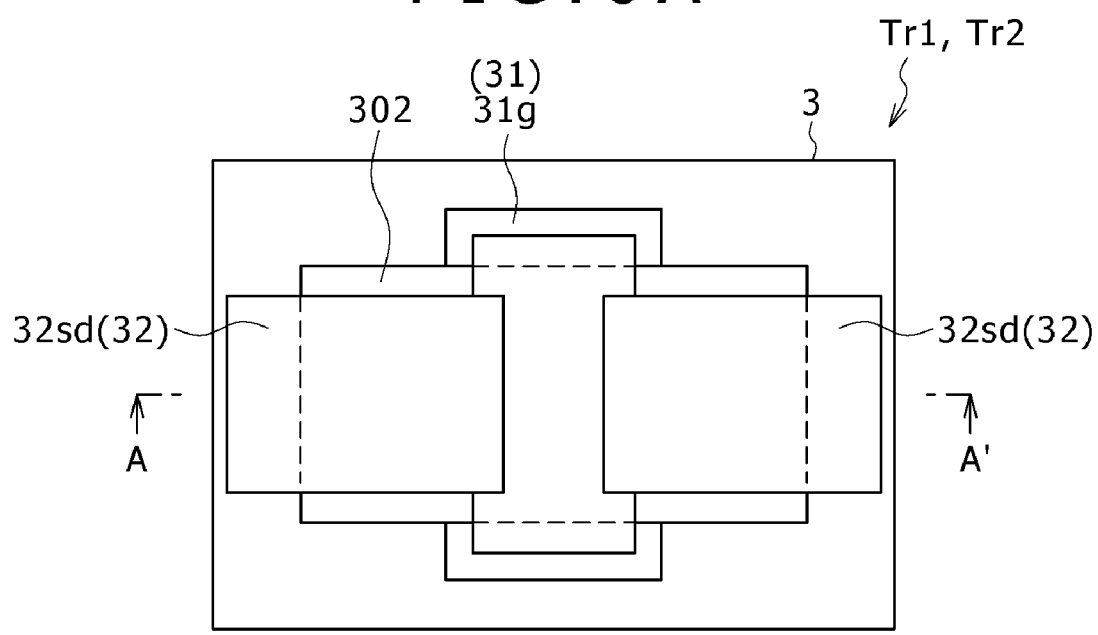
FIGS. 6A and 6B are diagrams showing an example of constitution of thin film transistors disposed in a driving circuit.
Figure 6B:
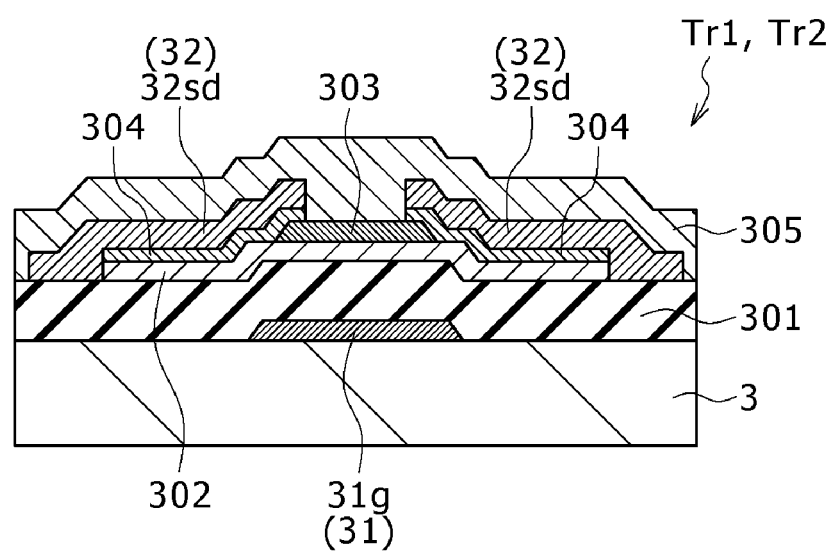

FIGS. 6A and 6B are diagrams showing an example of constitution of the thin film transistors Tr1 and Tr2 disposed in the driving circuit described above, FIG. 6A being a plan view, and FIG. 6B being a sectional view taken along a line A-A' in the plan view. As shown in these figures, the thin film transistors Tr1 and Tr2 have a gate electrode 31g made of the first conductive layer 31 disposed on the substrate 3. This gate electrode 31g is covered with a gate insulating film 301 (shown in only the sectional view). A channel part semiconductor layer 302 is provided on the gate insulating film 301. In addition, an insulative stopper layer 303 is disposed on the channel part semiconductor layer 302 at such a position as to be laminated above the gate electrode 31g, and further a source/drain 304 (shown in only the sectional view) made of an n-type semiconductor layer separated on the stopper layer 303 is provided. Further, source/drain electrodes 32sd made of the second conductive layer 32 are provided in a state of being connected to the source/drain 304. The thin film transistors Tr1 and Tr2 having such a constitution are covered with a passivation film 305 (shown in only the sectional view).

Incidentally, the above-described gate insulating film 301 is the first insulating film 301 providing insulation between the part of the lead wiring 5 made of the first conductive layer 31 and the annular auxiliary wiring 11 made of the second conductive layer 32 as shown in FIG. 5.

In the display device 1 of the above-described constitution, the plurality of pieces of annular auxiliary wiring 11 are arranged in a multiple manner (double in the drawings). Thus, when a short circuit occurs between one piece of annular auxiliary wiring 11 and the lead wiring 5 in a layer below the annular auxiliary wiring 11, the short-circuit part of the annular auxiliary wiring 11 can be disconnected (repaired) to avoid the short circuit with the lead wiring 5. For example, as shown in FIG. 7, when foreign matter As is inserted between the lead wiring 5 and the annular auxiliary wiring 11, the foreign matter As may cause a short circuit between the lead wiring 5 and the annular auxiliary wiring 11. In this case, the one piece of the double annular auxiliary wiring 11 is disconnected at two positions such that a part where the foreign matter As adheres between the annular auxiliary wiring 11 and the lead wiring 5 is cut off. Thereby the short circuit between the annular auxiliary wiring 11 and the lead wiring 5 can be avoided.

As described above, according to the embodiment of the present invention, by providing the multiple pieces of annular auxiliary wiring 11, a short-circuit part between the lead wiring 5 and the annular auxiliary wiring 11 disposed above the lead wiring 5 can be easily repaired by disconnecting a part of the annular auxiliary wiring 11, while a normal wiring function can be maintained by the remaining annular auxiliary wiring 11. As a result, a margin for a process of manufacturing the display device can be increased.

In addition, the second insulating film 13 covering the annular auxiliary wiring 11 and serving as a foundation layer for the organic electroluminescent light emitting element EL is provided with the multiple groove patterns 13a having the annular auxiliary wiring 11 as a bottom surface, so that the second insulating film 13 is divided in a multiple manner on the outside of the display region 3a. Thereby, the infiltration of water into the display region 3a via the second insulating film 13 formed by using an organic material can be surely prevented. Thus, degradation of the organic electroluminescent light emitting element EL provided in the display region 3a due to water can be prevented.

Further, because the infiltration of water is prevented in the groove pattern 13a provided on the annular auxiliary wiring 11 on the outside, the infiltration of water into the annular auxiliary wiring 11 disposed on the inside is prevented, and thus corrosion of the annular auxiliary wiring 11 on the inside is prevented.

Examples of Modification

Figure 8A:
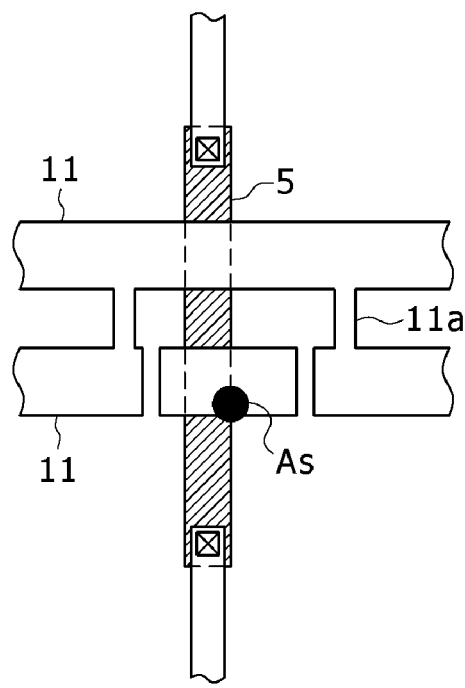
FIGS. 8A to 8C are layout diagrams of principal parts representing examples of modification of the embodiment.
Figure 8B:
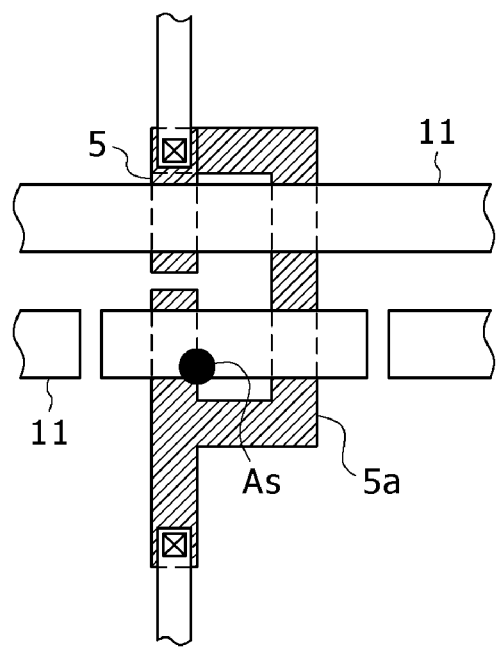
Figure 8C:
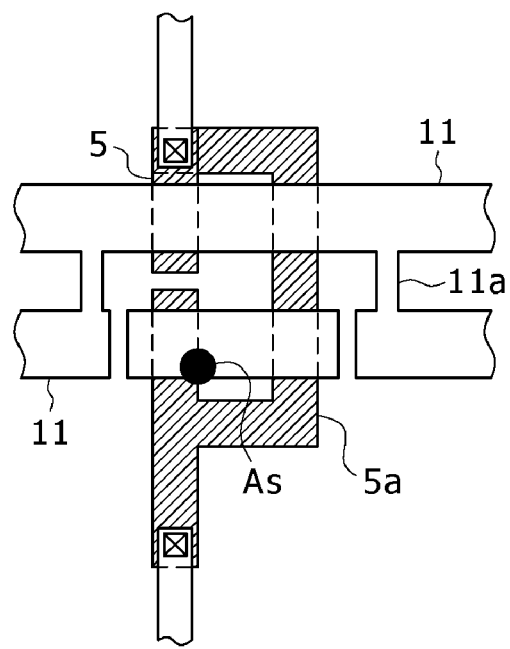

FIGS. 8A to 8C show a constitution of a laminated part of the lead wiring 5 drawn out from the display region to the peripheral region and the annular auxiliary wiring 11 arranged in a state of enclosing the display region in a multiple manner, as an example of modification of the display device 1 according to the foregoing embodiment.

As shown in FIG. 8A, a connection between the plurality of pieces of annular auxiliary wiring 11 and 11 arranged in a multiple manner may be established by connection wiring 11a. This makes it possible to maintain conductivity of the annular auxiliary wiring 11 more excellently, and to increase an effect of preventing a voltage drop in the upper electrode 15 connected to the annular auxiliary wiring 11. Also in such a constitution, when foreign matter As is inserted between the lead wiring 5 and the annular auxiliary wiring 11, the annular auxiliary wiring 11 is disconnected at two positions such that a part of the annular auxiliary wiring 11 where the foreign matter As adheres between the annular auxiliary wiring 11 and the lead wiring 5 is cut off. Thereby a short circuit between the annular auxiliary wiring 11 and the lead wiring 5 can be avoided.

As shown in FIG. 8B, the lead wiring 5 may be provided with a bypass 5a parallel with the lead wiring 5 at a part where the lead wiring 5 crosses the annular auxiliary wiring 11. When foreign matter As is inserted between the lead wiring 5 (or the bypass 5a) and the annular auxiliary wiring 11 in such a constitution, the annular auxiliary wiring 11 is disconnected at two positions such that a part of the annular auxiliary wiring 11 where the foreign matter As adheres between the annular auxiliary wiring 11 and the lead wiring 5 (or the bypass 5a) is cut off. Thereby a short circuit between the annular auxiliary wiring 11 and the lead wiring 5 can be avoided. In this case, the lead wiring 5 (or the bypass 5a) may be disconnected at two positions such that a part of the lead wiring 5 (or the bypass 5a) where the foreign matter adheres between the lead wiring 5 (or the bypass 5a) and the annular auxiliary wiring 11 is cut off.

As shown in FIG. 8C, a connection between the plurality of pieces of annular auxiliary wiring 11 and 11 arranged in a multiple manner may be established by connection wiring 11a, and a bypass 5a parallel with the lead wiring 5 may be provided at a part of the lead wiring 5 where the lead wiring 5 crosses the annular auxiliary wiring 11. This makes it possible to maintain conductivity of the annular auxiliary wiring 11 more excellently, and to increase an effect of preventing a voltage drop in the upper electrode 15 connected to the annular auxiliary wiring 11. When foreign matter As is inserted between the lead wiring 5 (or the bypass 5a) and the annular auxiliary wiring 11 in such a constitution, the annular auxiliary wiring 11 is disconnected at two positions such that a part of the annular auxiliary wiring 11 where the foreign matter As adheres between the annular auxiliary wiring 11 and the lead wiring 5 (or the bypass 5a) is cut off. Thereby a short circuit between the annular auxiliary wiring 11 and the lead wiring 5 can be avoided. In this case, the lead wiring 5 (or the bypass 5a) may be disconnected at two positions such that a part of the lead wiring 5 (or the bypass 5a) where the foreign matter adheres between the lead wiring 5 (or the bypass 5a) and the annular auxiliary wiring 11 is cut off.

<Method of Manufacturing Display Device>

Figure 9:
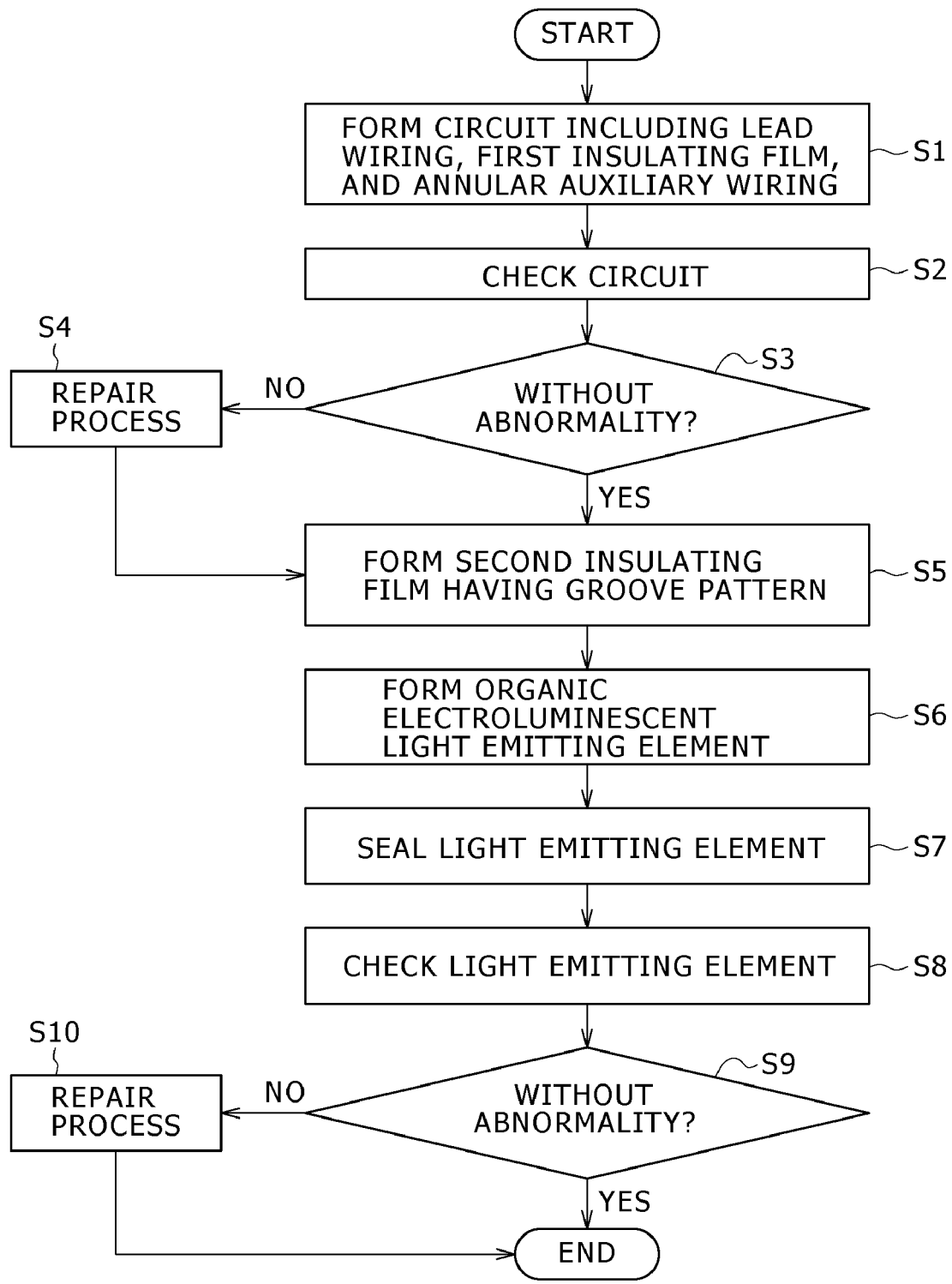
FIG. 9 is a flowchart of a method of manufacturing the display device.

FIG. 9 is a flowchart of assistance in explaining a method of manufacturing the display device having the above-described constitution. The procedure for manufacturing the display device will be described below with reference to FIG. 9. Incidentally, in the following, the manufacturing procedure will be described with reference to the sectional view of FIG. 5 in conjunction with the flowchart of FIG. 9.

First, in step S1, the lead wiring 5, the gate electrodes of the thin film transistors Tr1 and Tr2, the lower electrode of the capacitive element Cs, and the like made of the first conductive layer 31 are formed on the substrate 3. Next, the gate insulating film 301 is formed as first insulating film covering these parts. Thereafter, the semiconductor layer of the thin film transistors Tr1 and Tr2 is formed, and further the multiple pieces of annular auxiliary wiring 11, the source electrodes and the drain electrodes of the thin film transistors Tr1 and Tr2, the upper electrode of the capacitive element Cs, and the like made of the second conductive layer 32 are formed. Then, the pixel circuit is formed in each pixel within the display region 3a, and the driving circuit and the like are formed in the peripheral region 3b.

Next, in step S2, the circuits formed in step S1 are checked. In this case, circuit operation, for example, is checked. When there is an abnormality in operation, an abnormal part is identified by image detection.

Then, in step S3, whether or not the circuit check in step S2 indicates no abnormality is determined. When there is an abnormality (no), the process proceeds to step S4. When there is no abnormality (yes), the process proceeds to step S5.

In step S4, the abnormal part identified in step S2 is repaired. In this case, as described earlier with reference to FIG. 7 and FIGS. 8A to 8C, for example, the repair is made so as to disconnect a short circuit part between the lead wiring 5 and the annular auxiliary wiring 11. Then, after the repair is completed, the process proceeds to step S5.

In step S5, the second insulating film 13 covering the circuits using the first conductive layer 31 and the second conductive layer 32 formed on the substrate 3 and provided with the multiple ring-shaped groove patterns 13a having the annular auxiliary wiring 11 as a bottom surface is formed. The formation of the second insulating film 13 is for example performed by formation by coating of a photosensitive organic insulating film and a lithography process, and the second insulating film 13 is formed so as to have a flat surface. In addition, a connecting hole reaching the upper electrode of the capacitive element Cs provided in each pixel a is formed together with the groove patterns 13a in the second insulating film 13.

Next, in step S6, a process of forming the organic electroluminescent light emitting element EL on the second insulating film 13 is performed. At this time, the lower electrode 41 connected to the upper electrode of the capacitive element Cs is pattern-formed on the second insulating film 13 in each pixel a. In addition, the auxiliary wiring 41a connected to the annular auxiliary wiring 11 via the groove patterns 13a of the second insulating film 13 is formed with insulation of the auxiliary wiring 41a from the lower electrode 41 maintained. Next, the third insulating film 43 covering the periphery of the lower electrode 41 is pattern-formed. Thereafter, the light emitting functional layer 45 of a laminated structure is pattern-formed on the lower electrode 41 of each pixel a by a mask deposition method, for example. Thereafter, the upper electrode 15 is formed which covers all the pixels a in the display region 3a, and which is connected to the auxiliary wiring 41a and connected to the annular auxiliary wiring 11 at the bottom parts of the groove patterns 13a via the auxiliary wiring 41a.

Thereby, the organic electroluminescent light emitting element EL including the light emitting functional layer 45 sandwiched between the lower electrode 41 and the upper electrode 15 is formed in each pixel a within the display region 3a. In addition, the upper electrode 15 common to all the pixels a is connected to the auxiliary wiring 41a and the annular auxiliary wiring 11.

In next step S7, a process of sealing the organic electroluminescent light emitting element EL is performed. Though not shown in the sectional view, in this case, an inorganic insulating film is formed in a state of covering the organic electroluminescent light emitting element EL, and a sealing substrate is laminated onto the inorganic insulating film via an adhesive layer, whereby the organic electroluminescent light emitting element EL is sealed.

Thereafter, in step S8, the organic electroluminescent light emitting element EL is checked. In this case, a check is performed while the organic electroluminescent light emitting element EL is made to emit light. When there is an abnormality in state of light emission, an abnormal part is identified by image detection.

Then, in step S9, whether or not the check in step S8 indicates no abnormality is determined. When there is an abnormality (no), the process proceeds to step S10. When there is no abnormality (yes), the process is ended.

In step S10, the abnormal part identified in step S8 is repaired. Then, after the repair is completed, the process of manufacturing the display device is ended.

Incidentally, step S3 and step S4 may be performed after step S7.

As described above, by providing the multiple pieces of annular auxiliary wiring 11, a short-circuit part between the lead wiring 5 and the annular auxiliary wiring 11 disposed above the lead wiring 5 can be easily repaired by disconnecting a part of the annular auxiliary wiring 11, while a normal wiring function can be maintained by the remaining annular auxiliary wiring 11. As a result, a margin for the process of manufacturing the display device can be increased.

Examples of Application

A display device obtained by a manufacturing method according to an embodiment of the present invention described above can be applied to various electronic devices shown in FIGS. 10 to 14G, for example digital cameras, notebook personal computers, portable terminal devices such as portable telephones and the like, and video cameras. That is, the display device can be applied to display devices of electronic devices in all fields that display a video signal input thereto or a video signal generated therein as an image or video. An example of electronic devices to which the present invention is applied will be described in the following.

Figure 10:
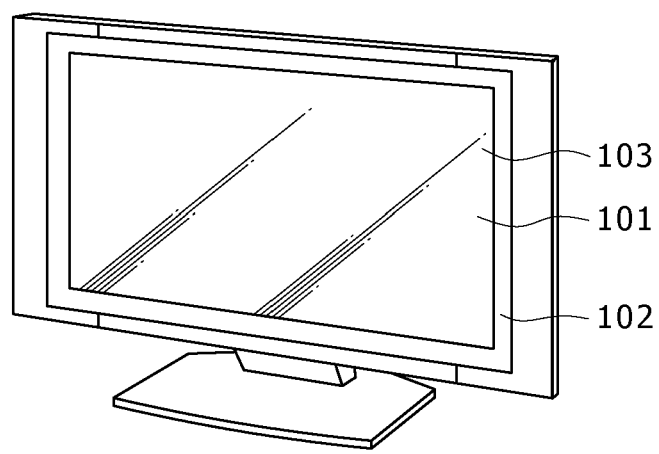
FIG. 10 is a perspective view of a television set to which the present invention is applied.

FIG. 10 is a perspective view of a television set to which the present invention is applied. The television set according to the present example of application includes a video display screen part 101 composed of a front panel 102, a filter glass 103 and the like. The television set is fabricated using a display device according to an embodiment of the present invention as the video display screen part 101.

Figure 11A:
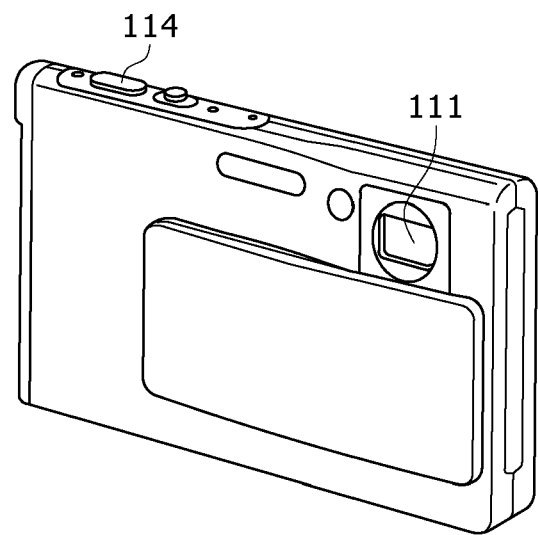
FIGS. 11A and 11B are diagrams showing a digital camera to which the present invention is applied, FIG. 11A being a perspective view of the digital camera as viewed from a front side, and FIG. 11B being a perspective view of the digital camera as viewed from a back side.
Figure 11B:
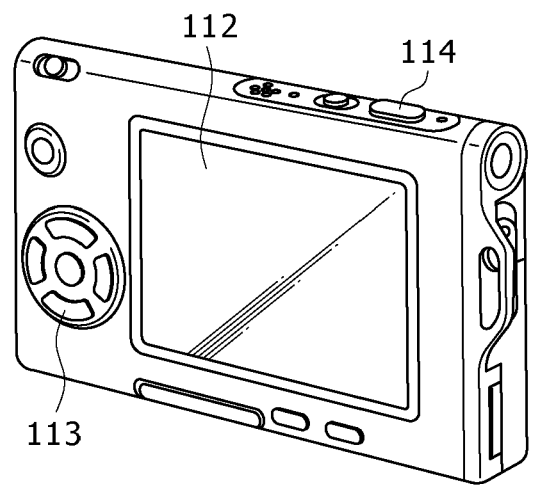

FIGS. 11A and 11B are diagrams showing a digital camera to which the present invention is applied. FIG. 11A is a perspective view of the digital camera as viewed from a front side, and FIG. 11B is a perspective view of the digital camera as viewed from a back side. The digital camera according to the present example of application includes a light emitting part 111 for flashlight, a display part 112, a menu switch 113, a shutter button 114, and the like. The digital camera is fabricated using a display device according to an embodiment of the present invention as the display part 112.

Figure 12:
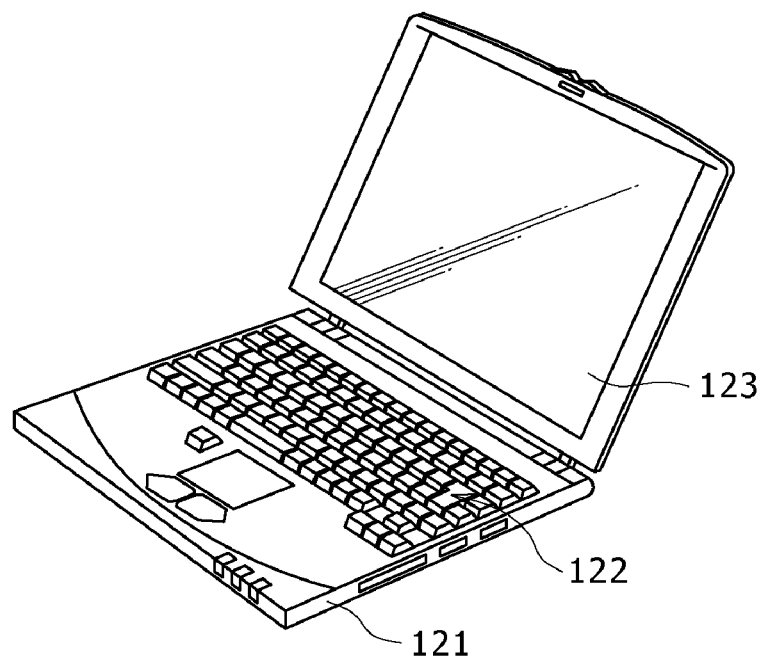
FIG. 12 is a perspective view of a notebook personal computer to which the present invention is applied.

FIG. 12 is a perspective view of a notebook personal computer to which the present invention is applied. The notebook personal computer according to the present example of application includes a keyboard 122 operated to input characters and the like, a display part 123 for displaying an image, and the like in a main unit 121. The notebook personal computer is fabricated using a display device according to an embodiment of the present invention as the display part 123.

Figure 13:
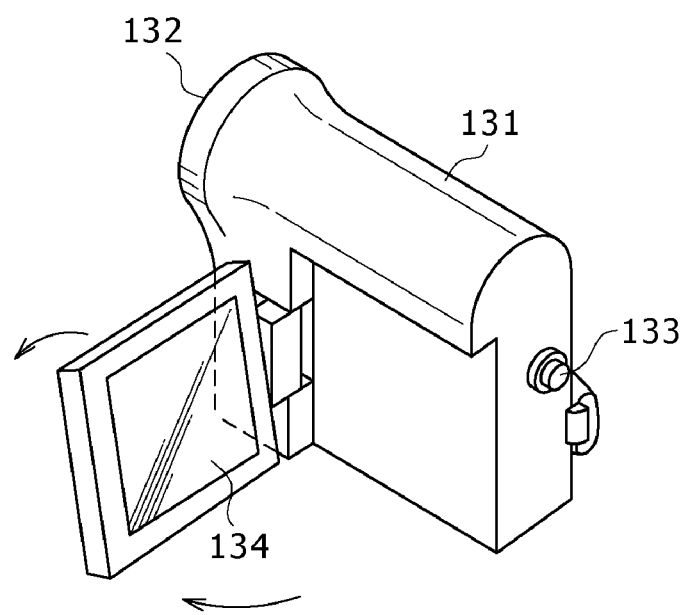
FIG. 13 is a perspective view of a video camera to which the present invention is applied.

FIG. 13 is a perspective view of a video camera to which the present invention is applied. The video camera according to the present example of application includes a main unit 131, a lens 132 for taking a subject in a side surface facing frontward, a start/stop switch 133 at a time of picture taking, a display part 134, and the like. The video camera is fabricated using a display device according to an embodiment of the present invention as the display part 134.

FIGS. 14A to 14G are diagrams showing a portable terminal device, for example a portable telephone to which the present invention is applied. FIG. 14A is a front view of the portable telephone in an opened state, FIG. 14B is a side view of the portable telephone in the opened state, FIG. 14C is a front view of the portable telephone in a closed state, FIG. 14D is a left side view of the portable telephone in the closed state, FIG. 14E is a right side view of the portable telephone in the closed state, FIG. 14F is a top view of the portable telephone in the closed state, and FIG. 14G is a bottom view of the portable telephone in the closed state. The portable telephone according to the present example of application includes an upper side casing 141, a lower side casing 142, a coupling part (a hinge part in this case) 143, a display 144, a sub-display 145, a picture light 146, a camera 147, and the like. The portable telephone is fabricated using a display device according to an embodiment of the present invention as the display 144 and the sub-display 145.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   lead wiring drawn out from a display region to a peripheral region of the display region;
   a first insulating film covering said lead wiring disposed on a substrate;
   a plurality of pieces of annular wiring disposed in a state of enclosing the display region in a multiple manner between said display region and said peripheral region on said first insulating film;
   a second insulating film covering said annular wiring disposed above said substrate, and having a plurality of groove patterns having each of the pieces of annular wiring as a bottom surface; and
   a light emitting element disposed on said second insulating film within said display region.

2. The display device according to claim 1,
   wherein said light emitting element is formed by sandwiching a light emitting functional layer between an upper electrode and a lower electrode.

3. The display device according to claim 2,
   wherein a pixel circuit connected to said lead wiring is disposed within said display region, and
   said lower electrode is connected to said pixel circuit.

4. The display device according to claim 2,
   wherein said upper electrode is connected to said annular wiring via said groove pattern.

5. The display device according to claim 1,
   wherein the pieces of annular wiring disposed in said multiple manner are connected to each other.

6. The display device according to claim 1, wherein said lead wiring has a bypass parallel with said lead wiring at a part where said lead wiring crosses said annular wiring.

7. The display device according to claim 1,
   wherein a plurality of said groove patterns are arranged in a state of enclosing said display region in a multiple manner.

8. A method of manufacturing a display device, comprising:
   a first step of forming lead wiring drawn out from a display region to a peripheral region of the display region;
   a second step of covering a substrate on which said lead wiring is disposed by a first insulating film;
   a third step of forming a plurality of pieces of annular wiring in a state of enclosing the display region in a multiple manner between said display region and said peripheral region on said first insulating film;
   a fourth step of checking said lead wiring and said annular wiring;
   a fifth step of, when a defective part is found in a check in said fourth step, repairing the defective part of said annular wiring;
   a sixth step of forming a second insulating film covering said substrate above which said annular wiring is disposed, and having a plurality of groove patterns having each of said pieces of annular wiring as a bottom surface after said fourth step; and
   a seventh step of forming a light emitting element on said second insulating film within said display region.

* * * * *